(12) United States Patent
Buhlmann et al.

(10) Patent No.: US 11,137,423 B2
(45) Date of Patent: Oct. 5, 2021

(54) CONTACTLESS VOLTAGE TRANSDUCER

(71) Applicant: LEM International SA, Plan-les-Ouates (CH)

(72) Inventors: Félix Buhlmann, Lausanne (CH); Dominik Schläfli, Nyon (CH); Wolfram Teppan, Wünnewil (CH)

(73) Assignee: LEM International SA, Plan-les-Ouates (CH)

( * ) Notice: Subject to any disclaimer, the term of this patent is extended or adjusted under 35 U.S.C. 154(b) by 0 days.

(21) Appl. No.: 16/624,598

(22) PCT Filed: Jul. 10, 2018

(86) PCT No.: PCT/EP2018/068620
§ 371 (c)(1),
(2) Date: Dec. 19, 2019

(87) PCT Pub. No.: WO2019/011896
PCT Pub. Date: Jan. 17, 2019

(65) Prior Publication Data
US 2020/0124643 A1    Apr. 23, 2020

(30) Foreign Application Priority Data

Jul. 12, 2017 (EP) .................................... 17181076

(51) Int. Cl.
*G01R 15/16* (2006.01)
*G01R 15/14* (2006.01)
(Continued)

(52) U.S. Cl.
CPC ........... *G01R 15/16* (2013.01); *G01R 15/142* (2013.01); *G01R 19/2513* (2013.01); *G05F 3/08* (2013.01); *H03M 1/001* (2013.01)

(58) Field of Classification Search
CPC ... G01R 15/16; G01R 15/142; G01R 19/2513
See application file for complete search history.

(56) References Cited

U.S. PATENT DOCUMENTS 5,473,244 A * 12/1995 Libove ..................... G01R 1/22
324/126
6,470,283 B1   10/2002 Edel
(Continued)

FOREIGN PATENT DOCUMENTS

EP        1249706       10/2002
JP        2007082383    3/2007

OTHER PUBLICATIONS

International Search Report and Written Opinion issued by the International Searching Authority, dated Nov. 6, 2018, for International Patent Application No. PCT/EP2018/068620; 13 pages.

(Continued)

*Primary Examiner* — Dominic E Hawkins
(74) *Attorney, Agent, or Firm* — Faegre Drinker Biddle & Reath LLP (57) ABSTRACT

Contactless voltage transducer for measuring voltages between at least two conductors of an alternating voltage conductor system, the transducer including two or more capacitive current measurement units, each said capacitive current measurement unit comprising an electrode surrounding a passage for receiving therethrough a respective said conductor of the alternating voltage conductor system, an electrode shield surrounding the electrode, an electrode signal processing circuit portion connected to the electrode and electrode shield, configured to output an analog measurement signal, and a reference voltage signal generator connected to the electrode shield and configured to generate a reference voltage source signal, (Continued)

wherein the reference voltage signal generators of the two or more capacitive current measurement units are connected together at a common floating voltage connection point.

30 Claims, 3 Drawing Sheets

(51) Int. Cl.
*G01R 19/25* (2006.01)
*G05F 3/08* (2006.01)
*H03M 1/00* (2006.01)

(56) References Cited

U.S. PATENT DOCUMENTS

| | | | |
|---|---|---|---|
| 9,151,792 B1* | 10/2015 | Kremin | G06F 1/169 |
| 2002/0097056 A1 | 7/2002 | Blades | |
| 2006/0076985 A1* | 4/2006 | Martinez | H03K 17/955 327/110 |
| 2009/0319210 A1 | 12/2009 | Yanagisawa | |
| 2012/0182038 A1 | 7/2012 | Marzetta | |
| 2014/0145730 A1 | 5/2014 | Makuth | |
| 2014/0370741 A1* | 12/2014 | Bolcato | H01B 9/006 439/471 |
| 2015/0199301 A1 | 7/2015 | Wu | |
| 2016/0003871 A1 | 1/2016 | Tourin-Lebret | |
| 2017/0305376 A1* | 10/2017 | Lamesch | B60R 21/01532 |

OTHER PUBLICATIONS

"Live working-Voltage detectors—Part 6: Guidelines on non-contact voltage detectors (NCVD) for use at nominal voltages above 1 kV AC", IEC TR 61243-6:2017, IEC, Mar. 2017; 44 pages.

* cited by examiner

CONTACTLESS VOLTAGE TRANSDUCER

CROSS-REFERENCE TO RELATED APPLICATIONS

The present application is a national stage entry of International (PCT) Patent Application Number PCT/EP2018/068620, filed Jul. 10, 2018, which in turn claims priority to European Patent Application No. 17181076.5, filed Jul. 12, 2017, the subject matter of which are expressly incorporated herein by reference.

FIELD OF THE INVENTION

This invention relates to a transducer for measuring alternating voltages in in a contactless manner.

BACKGROUND OF THE INVENTION

It is known to measure alternating (AC) voltages and relative phases between two to or more conductors (typically three phases and neutral) without interrupting and contacting the conductors. The conductors may for instance be in the form of electrical cables, and for instance a capacitive transducer with a split electrode is placed around each of the cables. The contactless transducer facilitates installation and decreases hazards to personnel and equipment, especially in hazardous voltage applications.

In order to reduce the effect of the unknown coupling capacitances between the cables and the transducer, and thus to enhance measurement precision, two (or more) reference voltage sources may be used as described in U.S. Pat. No. 5,473,244.

A main drawback of the system described in U.S. Pat. No. 5,473,244, and also in other contactless voltage measurement systems such as described in U.S. Pat. No. 6,470,283, is the need to have a ground terminal. Access to a ground connection at the position of installation of the voltage measurement transducer may not be readily available, and the need to install a galvanic connection increases the cost and complexity of the voltage measurement setup.

Moreover, for hazardous voltage applications, the need to implement a galvanic connection may increase risks to safety of personnel installing, maintaining or using the measurement equipment.

SUMMARY OF THE INVENTION

In view of the foregoing, it is an object of this invention to provide a contactless voltage transducer that is accurate and reliable, without requiring a ground connection.

It would be advantageous to provide a contactless voltage transducer that is safe and easy to install.

It would be advantageous to provide a contactless voltage transducer that is cost effective to manufacture and install.

Objects of this invention have been achieved by providing the contactless voltage transducer according to claim 1 or claim 13, and a method according to claim 15.

Disclosed herein is a contactless voltage transducer for measuring voltages between at least two conductors of an alternating voltage conductor system, the transducer including two or more capacitive current measurement units, each said capacitive current measurement unit comprising
- an electrode surrounding a passage for receiving therethrough a respective said conductor of the alternating voltage conductor system,
- an electrode shield surrounding the electrode,
- an electrode signal processing circuit portion connected to the electrode and electrode shield, configured to output an analog measurement signal, and
- a reference voltage signal generator connected to the electrode shield and configured to generate a reference voltage source signal,
- wherein the reference voltage signal generators of the two or more capacitive current measurement units are connected together at a common floating voltage connection point.

Also disclosed herein is a fully autonomous contactless voltage transducer without any direct electrical connections to external systems, for measuring voltages between at least two conductors of an alternating voltage conductor system of an external system, the transducer including a wireless communications module to transmit wirelessly measurement signals, and two or more capacitive current measurement units, each said capacitive current measurement unit comprising
- an electrode surrounding a passage for receiving therethrough a respective said conductor of the alternating voltage conductor system,
- an electrode shield surrounding the electrode,
- an electrode signal processing circuit portion connected to the electrode and electrode shield, configured to output an analog measurement signal, and
- a reference voltage signal generator connected to the electrode shield and configured to generate a reference voltage source signal,
- wherein the reference voltage signal generators of the two or more capacitive current measurement units are connected together at a common floating voltage connection point.

In an advantageous embodiment, the conductor system is a multiphase conductor system and the transducer comprises one capacitive current measurement unit for each phase of the electrical conduction system and in addition one for a neutral conductor.

In an advantageous embodiment, the transducer may further comprise an external electrostatic shield surrounding said two or more capacitive current measurement units, and an additional reference voltage signal generator connected to the external electrostatic shield and the common floating voltage connection point.

In an advantageous embodiment, the reference voltage signal generators are configured to generate said reference voltage source signals at frequencies higher than the alternating voltage frequency of the conductor system.

In an advantageous embodiment, at least two of the reference voltage signal generators are configured to generate said reference voltage source signal at different frequencies from each other.

In an embodiment, each of the reference voltage signal generators may be configured to generate said reference voltage source signal at a frequency different from the others.

In an embodiment, the voltage transducer may comprise a microcontroller circuit configured to compute an electrode-conductor admittance matrix Y from the reference voltage source signals and associated currents output by the capacitive current measurement units.

In an embodiment, the microcontroller circuit comprising a digital-to-analog converter (DAC) for generating reference Voltage signals and an analog-to-digital converter (ADC) for receiving and processing the analog measurement signal response from the output capacitive currents from each electrode.

Also disclosed herein is a method of measuring voltages between at least two conductors of an alternating voltage conductor system without a galvanic connection, comprising:
  providing a contactless voltage transducer as described above,
  generating reference voltage signals $V_i^{ref}$ and measuring corresponding output capacitive current signals $I_i^{ref}$ of the electrodes,
  identifying in a processing circuit of the transducer an admittance matrix Y based on the reference voltage signals and corresponding output capacitive current signals,
  computing, in the processing circuit of the transducer, an impedance matrix Z obtained from the admittance matrix Y, providing an identification of the conductor system.

The method may further comprise
  measuring electrode currents $I_i^{meas}$ of the conductor system, and
  computing in a processing circuit of the transducer, using the impedance matrix Z, the alternating voltage to be measured between said at least two conductors.

Further objects and advantageous aspects of the invention will be apparent from the claims, and from the following detailed description and accompanying figures.

BRIEF DESCRIPTION OF THE DRAWINGS

The invention will now be described with reference to the accompanying drawings, which by way of example illustrate the present invention and in which.

DETAILED DESCRIPTION OF EMBODIMENTS OF THE INVENTION

Referring to the figures, a contactless voltage transducer 2 according to an embodiment of the invention comprises two or more capacitive current measurement units 3, each comprising an electrode surrounding a passage 6 for receiving therethrough a respective conductor 1, 1n of a conductor system comprising at least two conductors, at least one of which carries an alternating voltage.

In an embodiment, the conductors of the conductor system may belong to a multi-phase alternating voltage electrical conduction system. The electrical conduction system may be two-phase, three phase or have four or more phases, and may comprise in additional a neutral conductor. It may however be noted that the invention is not limited to a multiphase system and may be applied to any conductors that exhibit a relative alternating voltage between measured conductors.

The conductors may for instance be in the form of conventional insulated wires or cables, or insulated conductor rods or bars, or have other per se known configurations. In a variant, the conductors may also be uninsulated, the contactless voltage transducer comprising an insulating layer on the electrodes configured to dielectrically separate the electrode from the uninsulated conductor.

The electrodes 4 may completely surround the conductor passage 6, or may only partially surround the conductor passage 6, for instance leaving a gap to allow insertion of the conductor in the passage 6.

The electrode may be provided in a housing with a movable portion to allow insertion of the conductor to be measured in a corresponding passage 6 of an electrode.

The contactless voltage transducer 2 is configured for measuring relative alternating voltages between any two or more conductors 1, 1n of the conduction system. The contactless voltage transducer 2 may also be configured for measuring relative phases between any two or more conductors 1, 1n of the conduction system.

Each capacitive current measurement unit 3 further comprises an electrode shield 8 surrounding the electrode 4, an electrode signal processing circuit connected to the electrode 4 and electrode shield 8, configured to output an analog measurement signal $S_1$, $S_2$, $S_3$, $S_4$, and a voltage signal generator 10 connected to the measurement shield and configured to generate a voltage signal $V_1$, $V_2$, $V_3$, $V_4$. The voltage signal generators 10 of the plurality of capacitive current measurement units are connected together at a common floating voltage connection point 11.

The contactless voltage transducer 2 may further comprise an analog-digital processing circuit 12 configured for processing the analog measurement signals $S_1 \ldots S_4$.

In an embodiment, the voltage transducer may further comprise an external shield 14 surrounding a plurality of the capacitive current measurement units 3.

In an embodiment, the analog-digital processing circuit 12 includes a microcontroller circuit comprising a digital-to-analog converter (DAC) for generating reference voltage signals and an analog-to-digital converter (ADC) for receiving and processing the analog measurement signal $S_1$, $S_2$, $S_3$, $S_4$ response.

The invention relies on the principle of measuring capacitive currents between electrodes and the conductors over initially unknown capacitances. To measure those capacitances, additional (small) known voltage signals are applied on the electrode shield by the voltages generators, such that voltages and currents can be determined, and in turn the impedances can be calculated.

The electrodes are on a potential relatively close to each other, thus enabling a single electronic system to process the measurements from all conductors of the multi-conductor conduction system. The electrostatic shield around all the electrodes and the electrodes simplifies the system of coupling impedances.

In prior art systems, in order to determine and thus adjust for the capacitive currents that pass via unknown earth capacitances, the transducer is calibrated using a voltage source connected to an earth potential, injecting a known voltage of high frequency between two electrodes. In the present invention however, a ground connection is not needed, whereby the voltage sources are connected to a floating point voltage. The transducer according to embodiments of the present invention may be provided without any connection to external conductors. The transducer according to embodiments of the present invention may thus may be installed without any electrical connections to the conductors to be measured or the device or equipment in which the transducer may be installed. Advantages include increased ease of installation and increased safety.

Referring to the figures, in the illustrated embodiments, each conductor 1 is capacitively coupled (capacitance $C_1$) to an electrode 4 and the electrode is surrounded by a shield 8 capacitively coupled to the electrode 4 (capacitance $C_2$) and the conductor 1 (capacitance $C_3$). An associated capacitive current through the electrode may be measured by the signal processing circuit portion 16 when a voltage is applied to the shield 8 by the voltage generator 10. The signal processing circuit portion may for instance be a current-to-voltage conversion circuit, which in its simplest form may consist in a resistor across which a voltage output corresponding to the capacitive current, is measured. In the illustrated embodiment, the signal processing circuit comprises an operational amplifier which accepts as input the capacitive current and gives an output voltage that is proportional to the capacitive input current. The illustrated exemplary circuit arrangement is also known as a transresistance amplifier.

Each voltage generator 10 supplies a reference alternating voltage source to the electrode shield (for example a sinusoidal waveform with a frequency of 1 kHz) which generates an output signal $S_1 \ldots S_4$ corresponding to the currents $I_1 \ldots I_4$ driven by those voltage sources $V_1 \ldots V_4$. The reference alternating voltage source $V_1 \ldots V_4$ and measured output currents $I_1 \ldots I_4$ may be used to obtain the previously unknown electrode-conductor admittances matrix Y.

In an embodiment, an extra voltage source $V_S$ may also be used to drive the outermost electrostatic shield 14 of the transducer. In a variant, the system may comprise a plurality of assembled shielded enclosures with electrodes connected to a central shielded unit through shielded cables, each shielded enclosure enclosing one or a plurality of the capacitive current measurement units 3.

The admittance matrix Y is processed in a microcontroller of the transducer to obtain the impedance matrix Z. With the impedance matrix Z, the unknown voltages on the conductors 1, 1n can be determined from a measurement of the currents flowing from the conductors 1, 1n to the electrodes 4 at a known or identified alternating voltage frequency f. The known or identified frequency f may for instance be a mains frequency of 50 Hz or 60 Hz with an essentially sinusoidal characteristic. The invention however may be implemented in conductor systems with other alternating voltage frequencies, or conductor systems carrying multi-tone voltage signals, or conductor systems with alternating voltages exhibiting non-sinusoidal characteristics.

In the invention it is also possible to estimate the quality of the system identification using the voltage reference signals, and if this quality degrades, to automatically and adaptively change the processing method, for instance by changing the voltage reference signals, by changing the filtering time constant or other process parameters in order to offer the optimal response for identifying the system under various conditions. For instance, when the system changes quickly, long time constants are not conducive to a better estimate, and in such case it is better to switch to a filter time constant that is in line with the system time constants. The errors may be higher than for a stable system, but smaller than when applying non-optimal filtering.

Signal processing for a contactless voltage transducer with a two conductor system (example neutral and phase or phase to phase) comprising a driven outermost shield will now be described by way of example. The exemplified processing for a two conductor system can easily be adapted to a system with more conductors, whereby the admittance matrix is augmented with a corresponding number of columns and lines.

The signal processing according to the invention comprises two important processing steps carried out by a processing circuit of the transducer:

admittance Y matrix identification from the measurement using the reference/calibrating voltage sources $V_i^{ref}$, conductor voltages computation using the impedance Z matrix obtained from the Admittance Y matrix identification and the measured electrode currents $I_i^{meas}$.

Y Matrix Identification

Figure 1:
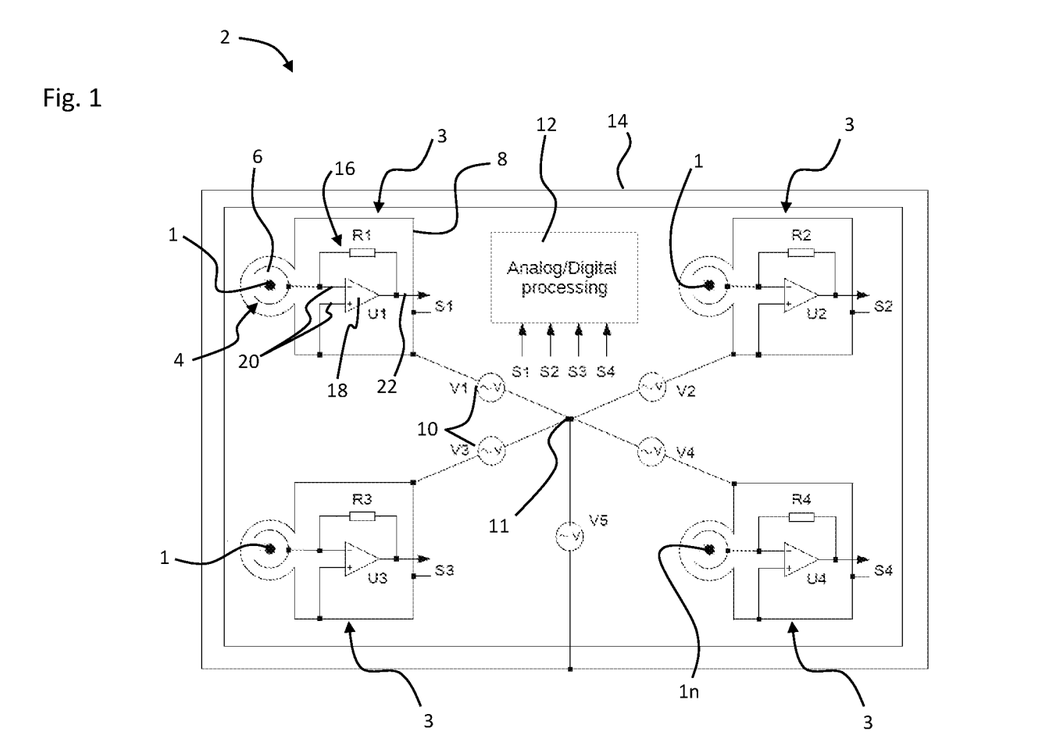
FIG. 1 is a schematic simplified diagram of an electrical layout of a contactless voltage transducer according to an embodiment of the invention.
Figure 2:
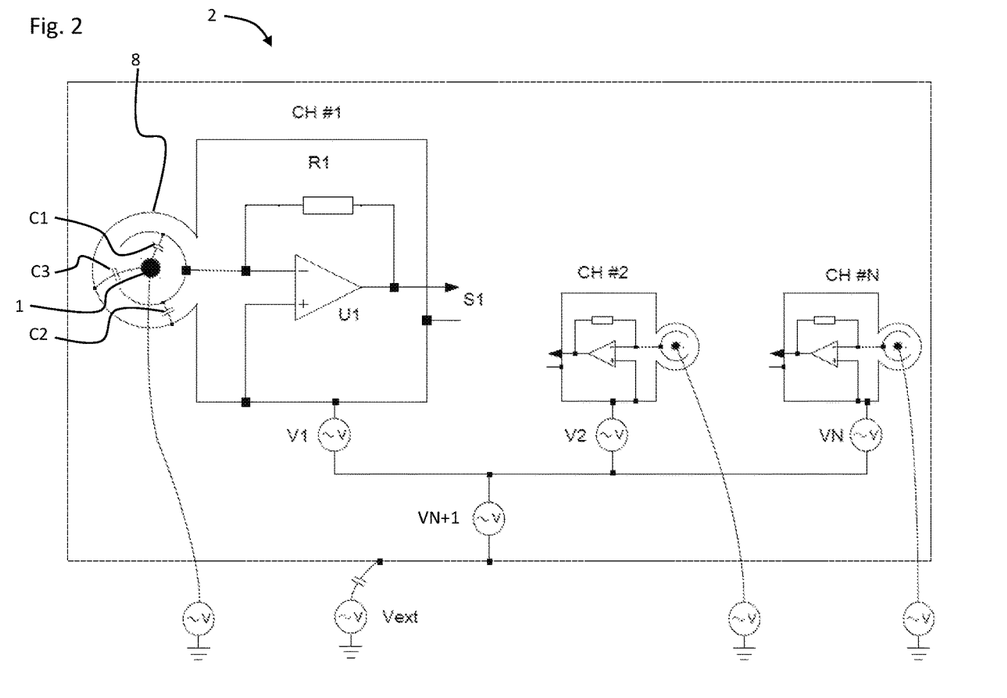
FIG. 2 is a schematic simplified diagram of the contactless voltage transducer of FIG. 1 for one of the phases, illustrating capacitive couplings between conductive elements of the transducer.
Figure 3:
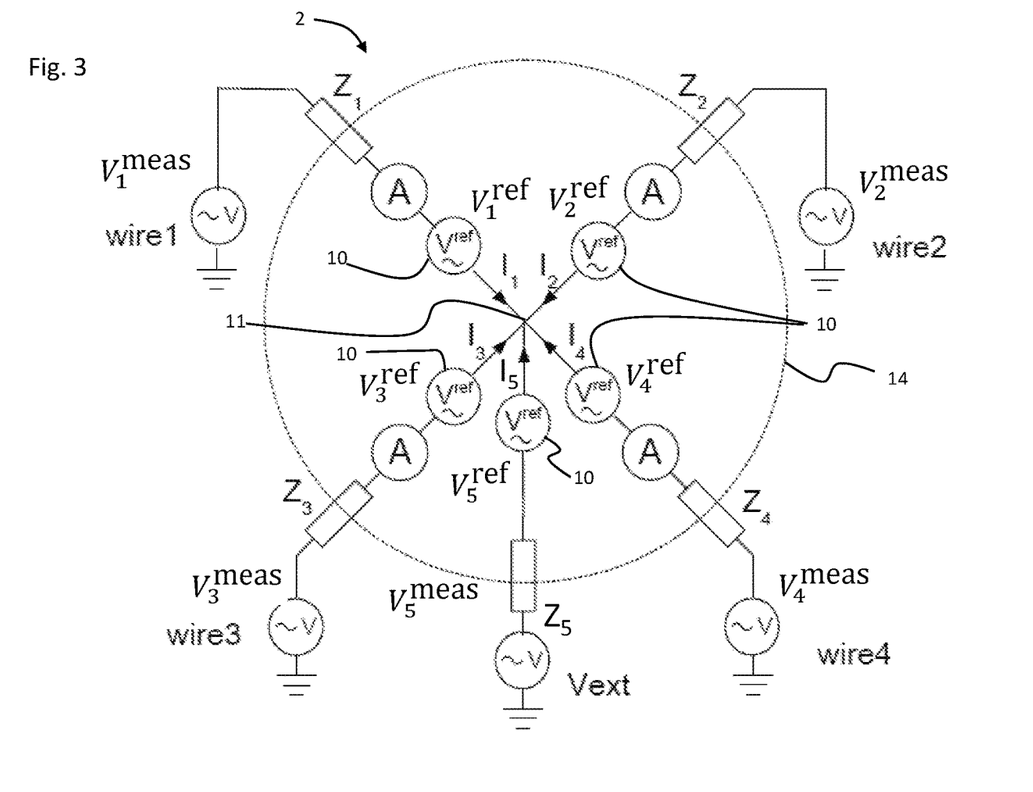
FIG. 3 is a schematic simplified diagram of an equivalent circuit representing the contactless voltage transducer.

The admittance matrix Y gives a relation between voltages and currents in the system (see FIG. 3).

$$\begin{pmatrix} I_1^{ref} \\ I_2^{ref} \end{pmatrix} = \begin{pmatrix} Y_{11} & Y_{12} & Y_{15} \\ Y_{21} & Y_{22} & Y_{25} \end{pmatrix} \begin{pmatrix} V_1^{ref} \\ V_2^{ref} \\ V_5^{ref} \end{pmatrix} \text{ with}$$

$$Y_{ij} = \frac{I_{ij}^{ref}}{V_j^{ref}}, \text{ with } V_k^{ref} \perp V_j^{ref} \text{ and } V_{k'}^{meas} \perp V_j^{ref}$$

for $k \neq j$, all $k'$ $I_{ij}^{ref}$ is the current in branch j generated by the reference source of branch j. $V_j^{ref}$ is the reference source of branch j. $I_{ij}^{ref}$ and $V_j^{ref}$ are complex numbers.

The relationship between the injected reference voltages $V^{ref}$, the measured resulting capacitive currents $I^{ref}$, and the admittance matrix may be expressed in a generalized compact form as:

$$I^{ref} Y(j\omega) V^{ref}$$

$Y_{ij}$ is in the general case a complex number or even a complex function of frequency $Y(\omega)$. In the present example, we identify the admittance matrix Y only at one frequency and we correct, translate or scale it (see $Y^*_{ij}$ below) for other frequencies. If the electrode-conductor system is only capacitive, then the real part of the admittance matrix Y is zero (i.e. there are assumed to be no resistive losses). This is however not the case if the dielectric surrounding the conductor (PVC or other) has losses. Here $V_k^{ref} \perp V_j^{ref}$ means that the source labeled k can be distinguished from $V_j^{ref}$ source, for example if the sources are switched on one after one, or each source is a sinusoidal signal with a different frequency, or various other characteristics. For instance one may have the voltage reference generators producing orthogonal signals (with 0 cross correlation). These signals could be a form of bandwidth limited pseudorandom sequence, covering the bandwidth of the signal to be measured, but long enough that the probability distribution for the cross correlation with the signal to be measured stays close to a very low value for most of the time. The important point is to use reference voltage waveforms so that the current $I_{ij}^{ref}$ in branch i generated by the source $V_j^{ref}$ in branch j can be determined without any ambiguity. The same is valid for the reference voltage waveforms and the measured voltage waveforms (such as 50 Hz or 60 Hz conduction systems and their possible harmonics).

In an embodiment, one may for instance use sinus waveforms for reference voltage sources with different frequencies just above 100 Hz (i.e. 127 Hz, 113 Hz, and 109 Hz). In that manner, the reference voltage sources can be distinguished easily from each other and from the voltage waveforms that are measured (such as 50 Hz or 60 Hz power systems and their possible harmonics). However, in variants, other methods can be used to identify and characterize the system.

In an embodiment, the reference voltage signals may be generated in a plurality of different frequencies on each line by the corresponding voltage generator, for instance at 40

Hz, 60 Hz, 80 Hz, 100 Hz and 120 Hz in order to generate a plurality of admittance matrices to better identify and characterize the system, taking into account the effects that varying voltages may have on the identified impedances of the system. In an embodiment, the reference voltage signals may be in the form of a multitone signal, or a signal that comprises non-sinusoidal wave forms.

More generally, the reference voltage signals may generate any sequence of signals that are at least partially orthogonal to the signal to measure and at least partially orthogonal to the other reference signals. The response to this reference voltage signal sequence may be extracted through correlation.

In an embodiment, the admittance matrix Y may be calculated in the following approximated manner (even though the real and the imaginary parts do not necessarily have the same frequency dependence). We can approximate that the real part, which can be associated to dielectric losses, should be small. The imaginary part, associated to the capacitive conductor-electrode coupling, is frequency dependent. This simplified approximated method gives good results when dielectric losses are small (but should be adjusted if dielectric losses are high).

$$Y_{ij}^* = \frac{I_{ij}^{ref}}{V_j^{ref}} \frac{f^{meas}}{f_j^{ref}}$$

Conductor Voltage Computation with Impedance Matrix Z

The impedance matrix Z is computed from the admittance matrix Y. In the general case, the impedance matrix Z is the pseudoinverse of the admittance matrix Y.

$$Z = pinv(Y)$$

In the present example we use $$Z^* = pinv(Y^*)F$$

With the impedance matrix Z, we can now compute the conductor voltage $V_i^{meas}$ from the current $I_i^{meas}$ generated by these sources in the electrodes.

$$\begin{pmatrix} V_1^{meas} \\ V_2^{meas} \\ V_5^{meas} \end{pmatrix} = \begin{pmatrix} Z_{11}^* & Z_{12}^* \\ Z_{21}^* & Z_{22}^* \\ Z_{51}^* & Z_{52}^* \end{pmatrix} \begin{pmatrix} I_1^{meas} \\ I_2^{meas} \end{pmatrix}$$

In a compact form this may be generalized as:

$$V^{meas} = Z^* I^{meas}$$

The voltage difference between conductor i and j is given by (also valid for the outer shield)

$$V_{ij}^{meas} = V_i^{meas} - V_j^{meas}$$

In the example discussed above, the admittance matrix includes the reference voltage of the shield $V_5^{ref}$, however the latter may be optional and in such case the calculation of the admittance matrix Y would be simplified to:

$$\begin{pmatrix} I_1^{ref} \\ I_2^{ref} \end{pmatrix} = \begin{pmatrix} Y_{11} & Y_{12} \\ Y_{21} & Y_{22} \end{pmatrix} \begin{pmatrix} V_1^{ref} \\ V_2^{ref} \end{pmatrix}$$

In this case the system becomes square and we can compute the voltage difference $V_{21}^{meas}$ between conductor 1 and 2 based on the following relations:

$$Z^* = inv(Y^*)$$

$$\begin{pmatrix} V_1^{meas} \\ V_2^{meas} \end{pmatrix} = \begin{pmatrix} Z_{11}^* & Z_{12}^* \\ Z_{21}^* & Z_{22}^* \end{pmatrix} \begin{pmatrix} I_1^{meas} \\ I_2^{meas} \end{pmatrix}$$

$$V_{21}^{meas} = V_2^{meas} - V_1^{meas}$$

In an embodiment, the transducer may further include onboard an autonomous power source, such as a battery. In a variant the transducer may comprise an energy harvesting unit configured to harvest power for operation of the transducer from the conductors of the system to be measured. The energy harvesting unit may for instance comprise one or more induction coils arrange axially adjacent, or coaxially around one or more of the electrodes, for mounting around one or more of the conductors.

In an embodiment, the transducer may further include a wireless communications module connected to the processor of the transducer to transmit wirelessly the measurement signals, and to receive commands or requests from an external system.

A fully autonomous wireless transducer without any galvanic connections may thus be provided for easy and versatile installation.

LIST OF REFERENCES IN THE DRAWINGS 2 voltage transducer
3 capacitive current measurement unit
    4 measurement electrode
        16 electrode signal processing circuit
            18 operational amplifier
                20 inputs ($-V_{in}$, $+V_{in}$)
                22 output
    6 passage
    8 electrostatic electrode shield
    10 voltage signal generator
    16 electrode signal processing circuit
    12 analog/digital processing circuit
    14 external electrostatic shield
    V Voltage
    I Current

The invention claimed is:

1. Contactless voltage transducer for measuring voltages between at least two conductors of an alternating voltage conductor system, the transducer including two or more capacitive current measurement units, each said capacitive current measurement unit comprising:
an electrode surrounding a passage for receiving therethrough a respective said conductor of the alternating voltage conductor system,
an electrode shield surrounding the electrode,
an electrode signal processing circuit portion connected to the electrode and electrode shield, configured to output an analog measurement signal, and
a reference voltage signal generator connected to the electrode shield and configured to generate a reference voltage source signal,
wherein the reference voltage signal generators of the two or more capacitive current measurement units are connected together at a common floating voltage connection point; an external electrostatic shield surrounding said two or more capacitive current measurement units; and an additional reference voltage signal generator connected to the external electrostatic shield and the common floating voltage connection point.

2. The contactless voltage transducer according to claim 1, wherein the conductor system is a multiphase conductor system and the transducer comprises one capacitive current measurement unit for each phase of the electrical conduction system and in addition one for a neutral conductor.

3. The contactless voltage transducer according to claim 2, wherein the conductor system is a two phase or three phase conductor system.

4. Contactless voltage transducer for measuring voltages between at least two conductors of an alternating voltage conductor system, the transducer including two or more capacitive current measurement units, each said capacitive current measurement unit comprising:
 an electrode surrounding a passage for receiving therethrough a respective said conductor of the alternating voltage conductor system,
 an electrode shield surrounding the electrode,
 an electrode signal processing circuit portion connected to the electrode and electrode shield, configured to output an analog measurement signal, and
 a reference voltage signal generator connected to the electrode shield and configured to generate a reference voltage source signal,
wherein the reference voltage signal generators of the two or more capacitive current measurement units are connected together at a common floating voltage connection point, and the reference voltage signal generators are configured to generate said reference voltage source signals at frequencies higher than the alternating voltage frequency of the conductor system.

5. The contactless voltage transducer according to claim 4, wherein the transducer comprises an autonomous power source in the form of a battery.

6. The contactless voltage transducer according to claim 4, wherein the transducer comprises a wireless communications module connected to the processor of the transducer to transmit wirelessly the measurement signals, and to receive commands or requests from an external system.

7. The contactless voltage transducer according to claim 4, wherein the conductor system is a multiphase conductor system and the transducer comprises one capacitive current measurement unit for each phase of the electrical conduction system and in addition one for a neutral conductor.

8. Contactless voltage transducer for measuring voltages between at least two conductors of an alternating voltage conductor system, the transducer including two or more capacitive current measurement units, each said capacitive current measurement unit comprising:
 an electrode surrounding a passage for receiving therethrough a respective said conductor of the alternating voltage conductor system,
 an electrode shield surrounding the electrode,
 an electrode signal processing circuit portion connected to the electrode and electrode shield, configured to output an analog measurement signal, and
 a reference voltage signal generator connected to the electrode shield and configured to generate a reference voltage source signal,
wherein the reference voltage signal generators of the two or more capacitive current measurement units are connected together at a common floating voltage connection point, and at least two of the reference voltage signal generators are configured to generate said reference voltage source signal at different frequencies from each other.

9. The contactless voltage transducer according to claim 8, wherein each of the reference voltage signal generators are configured to generate said reference voltage source signal at a frequency different from the others.

10. The contactless voltage transducer according to claim 8, wherein the conductor system is a multiphase conductor system and the transducer comprises one capacitive current measurement unit for each phase of the electrical conduction system and in addition one for a neutral conductor.

11. Contactless voltage transducer for measuring voltages between at least two conductors of an alternating voltage conductor system, the transducer including two or more capacitive current measurement units, each said capacitive current measurement unit comprising:
 an electrode surrounding a passage for receiving therethrough a respective said conductor of the alternating voltage conductor system,
 an electrode shield surrounding the electrode,
 an electrode signal processing circuit portion connected to the electrode and electrode shield, configured to output an analog measurement signal,
 a reference voltage signal generator connected to the electrode shield and configured to generate a reference voltage source signal,
wherein the reference voltage signal generators of the two or more capacitive current measurement units are connected together at a common floating voltage connection point and a microcontroller circuit configured to compute an electrode-conductor admittance matrix Y from the reference voltage source signals and associated currents output by the capacitive current measurement units, wherein the microcontroller circuit comprises a digital-to-analog converter (DAC) for generating the reference Voltage signals and an analog-to-digital converter (ADC) for receiving and processing the analog measurement signal response from the output capacitive currents from each electrode.

12. The contactless voltage transducer according to claim 11, wherein the transducer comprises an energy harvesting unit configured to harvest power from the conductors of the system to be measured, the energy harvesting unit comprising one or more induction coils arranged axially adjacent, or coaxially around one or more of the electrodes, for mounting around one or more of the conductors.

13. Method of measuring voltages between at least two conductors of an alternating voltage conductor system without a galvanic connection, comprising:
 providing a contactless voltage transducer for measuring voltages between at least two conductors of an alternating voltage conductor system, the contactless voltage transducer including two or more capacitive current measurement units, each said capacitive current measurement unit comprising:
  an electrode surrounding a passage for receiving therethrough a respective said conductor of the alternating voltage conductor system,
  an electrode shield surrounding the electrode,
  an electrode signal processing circuit portion connected to the electrode and electrode shield, configured to output an analog measurement signal, and
  a reference voltage signal generator connected to the electrode shield and configured to generate a reference voltage source signal, wherein the reference voltage signal generators of the two or more capacitive current measurement units are connected together at a common floating voltage connection point;

generating reference voltage signals $V_i^{ref}$ and measuring corresponding output capacitive current signals $I_i^{ref}$ of the electrodes;

identifying in a processing circuit of the transducer an admittance Y matrix based on the reference voltage signals and corresponding output capacitive current signals; and computing, in the processing circuit of the transducer, an impedance matrix Z obtained from the admittance matrix Y, providing an identification of the conductor system.

14. Method according to claim 13, comprising:
measuring electrode currents $I_i^{meas}$ of the conductor system, and computing in a processing circuit of the transducer, using the impedance matrix Z, the alternating voltage to be measured between said at least two conductors.

15. The autonomous contactless voltage transducer according to claim 13, wherein the transducer comprises an autonomous power source in the form of a battery.

16. The autonomous contactless voltage transducer according to claim 13, wherein the conductor system is a multiphase conductor system and the transducer comprises one capacitive current measurement unit for each phase of the electrical conduction system and in addition one for a neutral conductor.

17. A fully autonomous contactless voltage transducer without any direct electrical connections to external systems, for measuring voltages between at least two conductors of an alternating voltage conductor system of an external system, the transducer including a wireless communications module to transmit wirelessly measurement signals, and two or more capacitive current measurement units, each said capacitive current measurement unit comprising:

an electrode surrounding a passage for receiving therethrough a respective said conductor of the alternating voltage conductor system, an electrode shield surrounding the electrode, an electrode signal processing circuit portion connected to the electrode and electrode shield, configured to output an analog measurement signal, and a reference voltage signal generator connected to the electrode shield and configured to generate a reference voltage source signal, wherein the reference voltage signal generators of the two or more capacitive current measurement units are connected together at a common floating voltage connection point; an external electrostatic shield surrounding said two or more capacitive current measurement units, and an additional reference voltage signal generator connected to the external electrostatic shield and the common floating voltage connection point.

18. The autonomous contactless voltage transducer according to claim 17, wherein the transducer comprises an autonomous power source in the form of a battery.

19. The autonomous contactless voltage transducer according to claim 17, wherein the conductor system is a multiphase conductor system and the transducer comprises one capacitive current measurement unit for each phase of the electrical conduction system and in addition one for a neutral conductor.

20. A fully autonomous contactless voltage transducer without any direct electrical connections to external systems, for measuring voltages between at least two conductors of an alternating voltage conductor system of an external system, the transducer including a wireless communications module to transmit wirelessly measurement signals, and two or more capacitive current measurement units, each said capacitive current measurement unit comprising an electrode surrounding a passage for receiving therethrough a respective said conductor of the alternating voltage conductor system, an electrode shield surrounding the electrode, an electrode signal processing circuit portion connected to the electrode and electrode shield, configured to output an analog measurement signal, and a reference voltage signal generator connected to the electrode shield and configured to generate a reference voltage source signal, wherein the reference voltage signal generators of the two or more capacitive current measurement units are connected together at a common floating voltage connection point, and the reference voltage signal generators are configured to generate said reference voltage source signals at frequencies higher than the alternating voltage frequency of the conductor system.

21. The autonomous contactless voltage transducer according to claim 20, wherein the transducer comprises an autonomous power source in the form of a battery.

22. The autonomous contactless voltage transducer according to claim 20, wherein the conductor system is a multiphase conductor system and the transducer comprises one capacitive current measurement unit for each phase of the electrical conduction system and in addition one for a neutral conductor.

23. A fully autonomous contactless voltage transducer without any direct electrical connections to external systems, for measuring voltages between at least two conductors of an alternating voltage conductor system of an external system, the transducer including a wireless communications module to transmit wirelessly measurement signals, and two or more capacitive current measurement units, each said capacitive current measurement unit comprising:

an electrode surrounding a passage for receiving therethrough a respective said conductor of the alternating voltage conductor system, an electrode shield surrounding the electrode, an electrode signal processing circuit portion connected to the electrode and electrode shield, configured to output an analog measurement signal, and a reference voltage signal generator connected to the electrode shield and configured to generate a reference voltage source signal, wherein the reference voltage signal generators of the two or more capacitive current measurement units are connected together at a common floating voltage connection point, and at least two of the reference voltage signal generators are configured to generate said reference voltage source signal at different frequencies from each other.

24. The autonomous contactless voltage transducer according to claim 23, wherein each of the reference voltage signal generators are configured to generate said reference voltage source signal at a frequency different from the others.

25. The autonomous contactless voltage transducer according to claim 23, wherein the transducer comprises an autonomous power source in the form of a battery.

26. The autonomous contactless voltage transducer according to claim 23, wherein the conductor system is a multiphase conductor system and the transducer comprises one capacitive current measurement unit for each phase of the electrical conduction system and in addition one for a neutral conductor.

27. A fully autonomous contactless voltage transducer without any direct electrical connections to external systems, for measuring voltages between at least two conductors of an alternating voltage conductor system of an external system, the transducer including a wireless communications module to transmit wirelessly measurement signals, and two or more capacitive current measurement units, each said capacitive current measurement unit comprising
- an electrode surrounding a passage for receiving therethrough a respective said conductor of the alternating voltage conductor system,
- an electrode shield surrounding the electrode,
- an electrode signal processing circuit portion connected to the electrode and electrode shield, configured to output an analog measurement signal, and
- a reference voltage signal generator connected to the electrode shield and configured to generate a reference voltage source signal,
- wherein the reference voltage signal generators of the two or more capacitive current measurement units are connected together at a common floating voltage connection point; and a microcontroller circuit configured to compute an electrode-conductor admittance matrix Y from the reference voltage source signals and associated currents output by the capacitive current measurement units, and wherein the microcontroller circuit comprises a digital-to-analog converter (DAC) for generating the reference Voltage signals and an analog-to-digital converter (ADC) for receiving and processing the analog measurement signal response from the output capacitive currents from each electrode.

28. The autonomous contactless voltage transducer according to claim 27, wherein the transducer comprises an energy harvesting unit configured to harvest power from the conductors of the system to be measured, the energy harvesting unit comprising one or more induction coils arranged axially adjacent, or coaxially around one or more of the electrodes, for mounting one or more of the conductors.

29. The autonomous contactless voltage transducer according to claim 27, wherein the transducer comprises an autonomous power source in the form of a battery.

30. The autonomous contactless voltage transducer according to claim 27, wherein the conductor system is a multiphase conductor system and the transducer comprises one capacitive current measurement unit for each phase of the electrical conduction system and in addition one for a neutral conductor.

* * * * *